United States Patent
Rathburn

(10) Patent No.: US 7,214,069 B2
(45) Date of Patent: May 8, 2007

(54) NORMALLY CLOSED ZERO INSERTION FORCE CONNECTOR

(75) Inventor: James J. Rathburn, Greenfield, MN (US)

(73) Assignee: Gryphics, Inc., Plymouth, MN (US)

( * ) Notice: Subject to any disclaimer, the term of this patent is extended or adjusted under 35 U.S.C. 154(b) by 0 days.

(21) Appl. No.: 11/325,127

(22) Filed: Jan. 4, 2006

(65) Prior Publication Data

US 2006/0116004 A1 Jun. 1, 2006

Related U.S. Application Data

(63) Continuation of application No. PCT/US2004/021292, filed on Jul. 1, 2004.

(60) Provisional application No. 60/485,508, filed on Jul. 7, 2003.

(51) Int. Cl.
*H01R 12/00* (2006.01)

(52) U.S. Cl. .................................................. 439/66

(58) Field of Classification Search ............... 439/66, 439/591–592, 71, 91
See application file for complete search history.

(56) References Cited

U.S. PATENT DOCUMENTS

| | | | |
|---|---|---|---|
| 4,118,090 A | 10/1978 | Del Mei | |
| 4,161,346 A | 7/1979 | Cherian et al. | |
| 4,165,909 A | 8/1979 | Yeager et al. | |
| 4,189,200 A | 2/1980 | Yeager et al. | |
| 4,445,735 A | 5/1984 | Bonnefoy | |
| 4,468,074 A | 8/1984 | Gordon | |
| 4,498,722 A | 2/1985 | Fedder et al. | |
| 4,509,099 A | 4/1985 | Takamatsu et al. | |
| 4,548,451 A | 10/1985 | Benarr et al. | |
| 4,575,170 A | 3/1986 | Gurley | |
| 4,579,411 A | 4/1986 | Cobaugh et al. | |
| 4,593,961 A | 6/1986 | Cosmo | |
| 4,603,928 A | 8/1986 | Evans | |

(Continued)

FOREIGN PATENT DOCUMENTS

EP 0 310 302 B1 4/1989

(Continued)

OTHER PUBLICATIONS

Patent Cooperation Treaty (PCT); 'Notification Concerning Transmittal of Copy of International Preliminary Report on Patentability (Chapter 1 of the Patent Cooperation Treaty)' for International Application No. PCT/US2004/021292; Jan. 19, 2006; 8 pgs.

*Primary Examiner*—J. F. Duverne
(74) *Attorney, Agent, or Firm*—Faegre & Benson LLP

(57) ABSTRACT

A normally closed connector apparatus for electrically connecting first and second circuit members. An electrically insulative connector housing having a first portion translatable relative to a second portion is provided. The connector housing is adapted to be positioned substantially between the first and second circuit members. A plurality of resilient contact members are retained in the first portion of the housing. The contact members have first distal ends that do not extend substantially above an upper surface of the second portion. Displacement of the second portion relative to the first portion in a translated configuration positions the first distal ends of the contact members above the upper surface of the second portion to electrically couple with the first circuit member.

33 Claims, 6 Drawing Sheets

U.S. PATENT DOCUMENTS

| | | |
|---|---|---|
| 4,610,495 A | 9/1986 | Landi |
| 4,629,270 A | 12/1986 | Andrews, Jr. et al. |
| 4,648,668 A | 3/1987 | Sinisi |
| 4,655,524 A | 4/1987 | Etzel |
| 4,691,972 A | 9/1987 | Gordon |
| 4,758,176 A | 7/1988 | Abe et al. |
| 4,768,971 A | 9/1988 | Simpson |
| 4,789,345 A | 12/1988 | Carter |
| 4,793,814 A | 12/1988 | Zifcak et al. |
| 4,872,853 A | 10/1989 | Webster |
| 4,904,197 A | 2/1990 | Cabourne |
| 4,913,656 A | 4/1990 | Gordon et al. |
| 4,927,369 A | 5/1990 | Grabbe et al. |
| 5,007,842 A | 4/1991 | Deak et al. |
| 5,049,084 A | 9/1991 | Bakke |
| 5,061,192 A | 10/1991 | Chapin et al. |
| 5,071,359 A | 12/1991 | Arnio et al. |
| 5,096,426 A | 3/1992 | Simpson et al. |
| 5,156,553 A | 10/1992 | Katsumata et al. |
| 5,163,834 A | 11/1992 | Chapin et al. |
| 5,167,512 A | 12/1992 | Walkup |
| 5,173,055 A | 12/1992 | Grabbe |
| 5,199,889 A | 4/1993 | McDevitt, Jr. |
| 5,207,585 A | 5/1993 | Byrnes et al. |
| 5,227,959 A | 7/1993 | Rubinstein et al. |
| 5,252,916 A | 10/1993 | Swart |
| 5,299,090 A | 3/1994 | Brady et al. |
| 5,324,205 A | 6/1994 | Ahmad et al. |
| 5,338,207 A | 8/1994 | Lineberry et al. |
| 5,342,205 A | 8/1994 | Hashiguchi |
| 5,395,252 A | 3/1995 | White |
| 5,410,260 A | 4/1995 | Kazama |
| 5,412,329 A | 5/1995 | Iino et al. |
| 5,427,535 A | 6/1995 | Sinclair |
| 5,437,556 A | 8/1995 | Bargain et al. |
| 5,521,519 A | 5/1996 | Faure et al. |
| 5,637,539 A | 6/1997 | Hofmann et al. |
| 5,645,433 A | 7/1997 | Johnson |
| 5,653,598 A | 8/1997 | Grabbe |
| 5,723,347 A | 3/1998 | Hirano et al. |
| 5,795,172 A | 8/1998 | Shahriari et al. |
| 5,893,761 A | 4/1999 | Longueville |
| 5,913,687 A | 6/1999 | Rathburn |
| 5,919,050 A | 7/1999 | Kehley et al. |
| 5,920,765 A | 7/1999 | Naum et al. |
| 5,923,178 A | 7/1999 | Higgins et al. |
| 5,938,451 A | 8/1999 | Rathburn |
| 5,947,749 A | 9/1999 | Rathburn |
| 5,984,691 A | 11/1999 | Brodsky et al. |
| 6,004,151 A | 12/1999 | Hashiguchi |
| 6,079,987 A | 6/2000 | Matsunaga et al. |
| 6,135,783 A | 10/2000 | Rathburn |
| 6,178,629 B1 | 1/2001 | Rathburn |
| 6,231,353 B1 | 5/2001 | Rathburn |
| 6,247,938 B1 | 6/2001 | Rathburn |
| 6,294,920 B1 | 9/2001 | Pfaff |
| 6,409,521 B1 | 6/2002 | Rathburn |
| 6,572,396 B1 | 6/2003 | Rathburn |
| 6,793,504 B2 * | 9/2004 | Noda et al. .................. 439/71 |

FOREIGN PATENT DOCUMENTS

| | | |
|---|---|---|
| EP | 0 351 851 A3 | 1/1990 |
| EP | 0 405 333 A3 | 1/1991 |
| EP | 0 431 566 A1 | 6/1991 |
| EP | 0 571 879 B1 | 1/1993 |
| EP | 0 574 793 B1 | 12/1993 |
| EP | 0 817 319 B1 | 1/1998 |
| GB | 1 488 328 | 10/1977 |
| GB | 2 027 560 A | 2/1980 |
| GB | 2 274 212 A | 7/1994 |
| WO | 98/13695 A1 | 4/1998 |
| WO | 98/50985 A1 | 11/1998 |
| WO | 00/46885 A1 | 8/2000 |
| WO | 01/09980 A3 | 2/2001 |
| WO | 01/54232 A3 | 7/2001 |

* cited by examiner

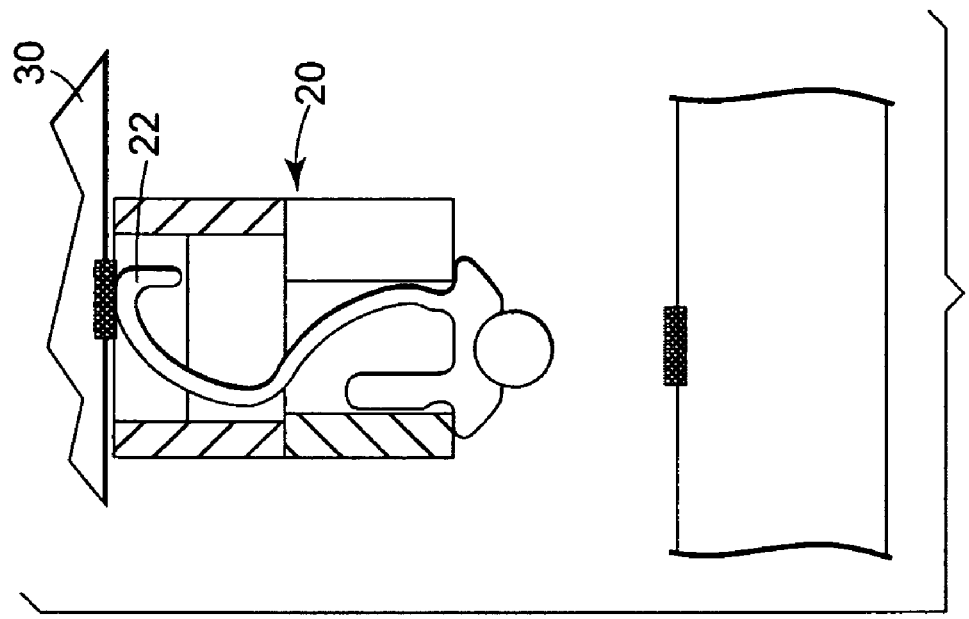
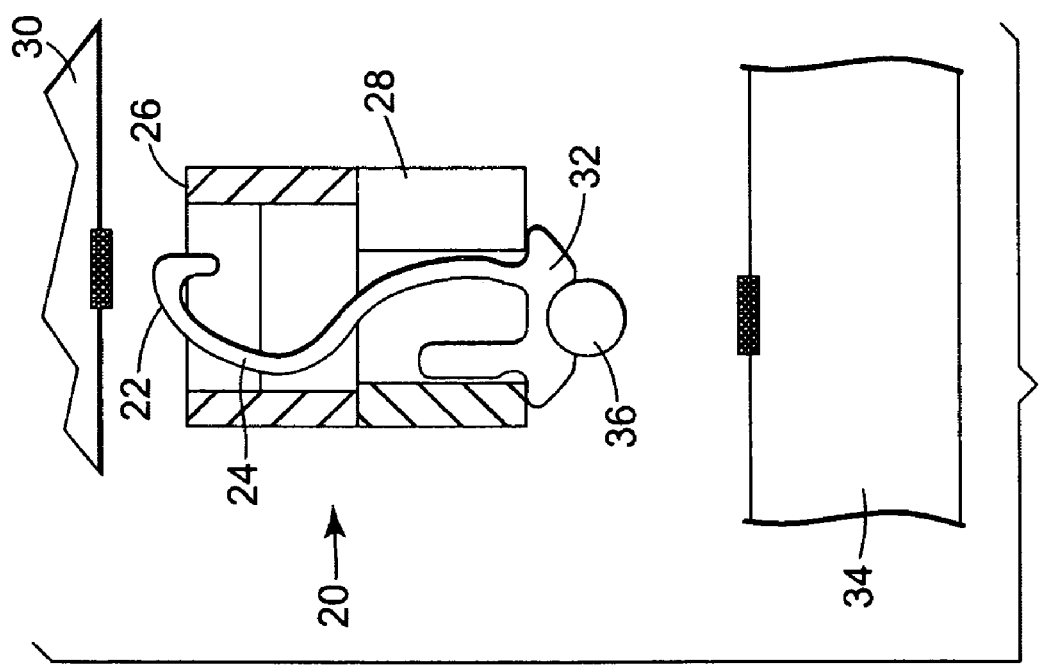

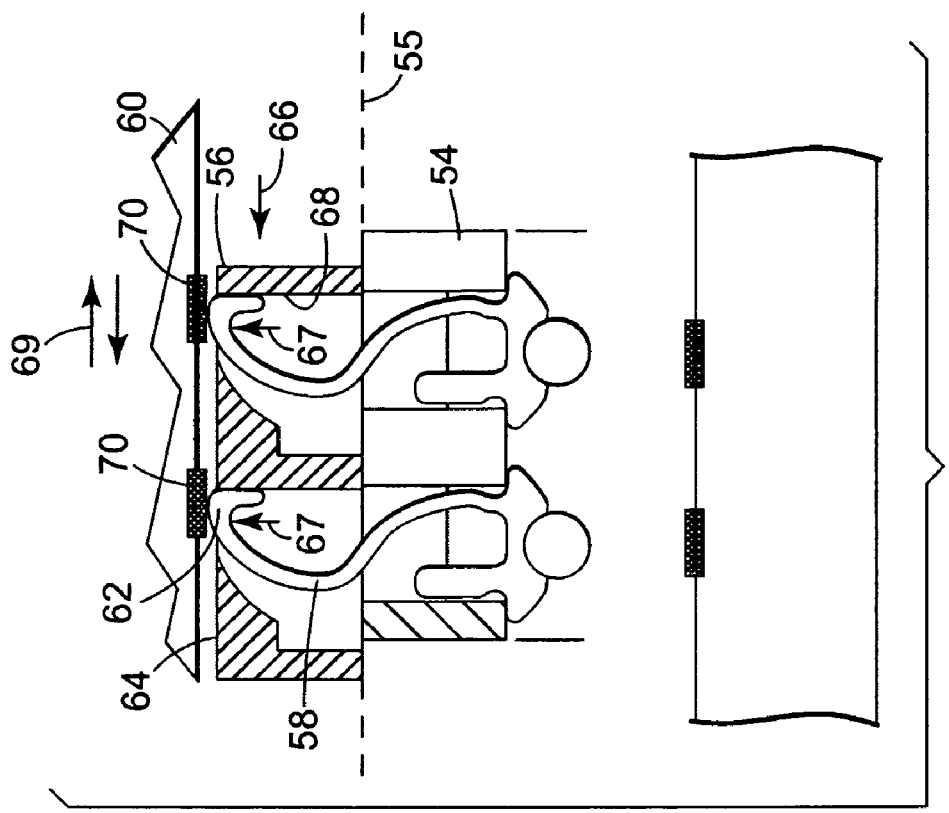
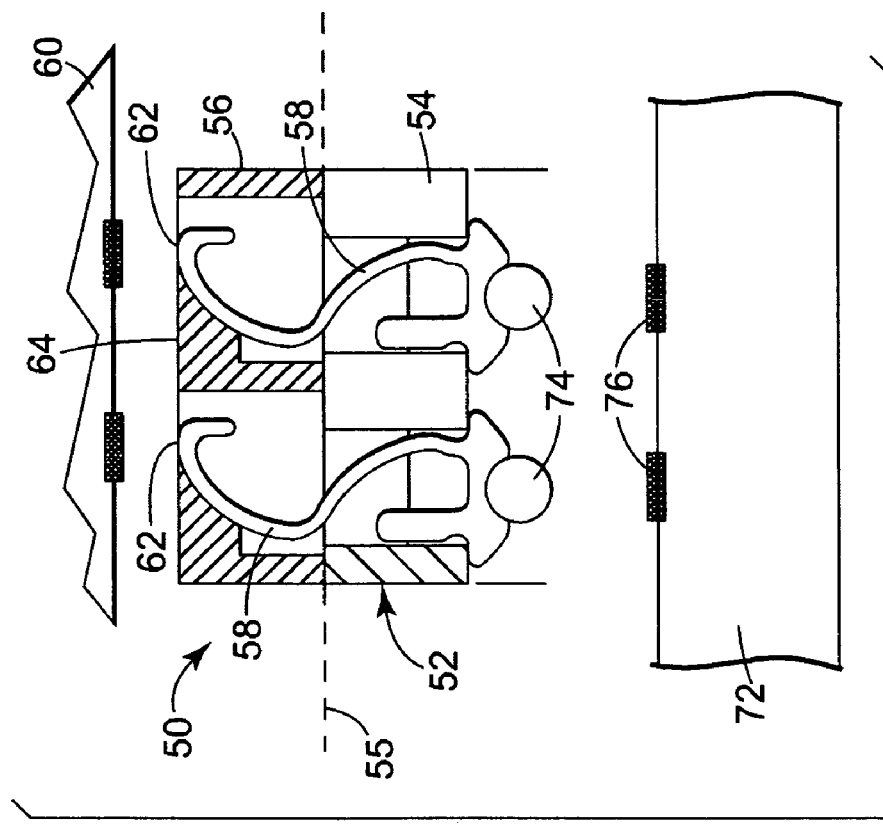
Fig. 4
Fig. 3

NORMALLY CLOSED ZERO INSERTION FORCE CONNECTOR

The present application is a continuation of prior application no. PCT/US2004/021292 entitled Normally Closed Zero Insertion Force Connector, filed Jul. 1, 2004, which claims the benefit of U.S. Provisional Patent application Ser. No. 60/485,508, entitled Normally Closed Zero Insertion Force Connector, filed Jul. 7, 2003, the complete disclosure of which are hereby incorporated by reference.

FIELD OF THE INVENTION

The present invention is directed to a normally closed, zero insertion force connector and to a replaceable chip module utilizing the present connector for electrically connecting one or more first circuit members to a second circuit member.

BACKGROUND OF THE INVENTION

The current trend in connector design for those connectors utilized in the computer field is to provide both high density and high reliability connectors between various circuit devices. High reliability for such connections is essential due to potential system failure caused by improper connections of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using a conventional mechanism. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. The plastic housings of these connectors undergo a significant amount of thermal activity during the soldering process, which stresses the component and threatens reliability.

The soldered contacts on the connector body are typically the mechanical support for the device being interfaced by the connector and are subject to fatigue, stress deformation, solder bridging, and co-planarity errors, potentially causing premature failure or loss of continuity. In particular, as the mating connector or semiconductor device is inserted and removed from the connector attached to the printed circuit board, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflowed to form the electrical interconnection. While this technique has proven successful in providing high-density interconnections for various structures, this technique does not allow facile separation and subsequent reconnection of the circuit members.

FIGS. 1 and 2 illustrate an LGA socket or connector 20 where first distal end 22 of contact member 24 extends above upper surface 26 of the connector insulator housing 28. As best illustrated in FIG. 2, an LGA device 30 is then pressed against the distal end 22 by applying a load through some mechanical device such as fasteners, springs, heat sinks, or levers. Second distal end 32 of the contact member 24 is electrically coupled to a second circuit member 34, such as a printed circuit board, using a solder ball 36. The connector 20 in FIG. 1 is referred to as "normally open" since the first distal end 22 of the contact member 24 extends above the upper surface 26 prior to engagement with the LGA device 30.

The normally open configuration of the connector 20 illustrated FIGS. 1 and 2 has at least two mechanical features that are undesirable in some circumstances. First, the first distal end 22 of the contact member 24 is exposed to damage prior to being engaged with the LGA device 30. Second, the stress applied to the connector 20 is relatively large due to the relatively large load requirements to be applied to the LGA device 30 in order to maintain reliable long-term contact to the connector 20.

BRIEF SUMMARY OF THE INVENTION

The present invention is directed to a normally closed connector apparatus for electrically connecting first and second circuit members. An electrically insulative connector housing having a first portion translatable relative to a second portion is provided. The connector housing is adapted to be positioned substantially between the first and second circuit members. A plurality of resilient contact members are retained in the first portion of the housing. The contact members have first distal ends that do not extend substantially above an upper surface of the second portion. Displacement of the second portion relative to the first portion in a translated configuration positions the first distal end of the contact member above the upper surface of the second portion to electrically couple with the first circuit member.

The second portion can be translated relative to the first portion in any direction. In one embodiment, the second portion deflects the contact members in the translated configuration so that the first distal ends extend above the upper surface of the second portion. In another embodiment, the translated configuration reduces a deflecting force on the contact members so that the first distal ends extend above the upper surface of the second portion. The first portion preferably translates relative to the second portion in a single plane. In one embodiment, a compressible material located between the first and second portions is compress to expose the first distal ends of the contact members.

The elastic deformation of the contact members can be defined by the geometry of the contact members, such as the thickness of the contact members. The contact members can be a planar structure where elastic deformation of the contact member is defined by at least one cutout in the planar structure. The contact members can have at least one helical portion. The contact members can be a planar structure with a first distal end at a generally right angle with respect to the planar structure. The first distal end can have a shape complementary to a shape of a contact pad on the first circuit member.

The contact members preferably include second distal ends that extend above a lower surface of the first portion. The second distal ends typically electrically and mechanically couple to the second circuit member. The circuit members can be one of a packaged integrated circuit device, an unpackaged integrated circuit device, a printed circuit board, a flexible circuit, a bare-die device, an organic or inorganic substrate, or a rigid circuit. The first circuit member is preferably an LGA device.

The present invention is also directed to a method of using a normally closed connector apparatus. A plurality of resilient contact members are located in a first portion of the housing. A second portion of the housing is positioned adjacent to the first portion so that first distal ends of the contact members extend through the second portion but do not extend substantially above an upper surface of the second portion. The second portion is displaced relative to the first portion so that the first distal ends of the contact members are positioned above the upper surface of the second portion.

In one embodiment, the step of positioning the second portion adjacent to the first portion deflects the contact member so that the first distal ends do not extend above the upper surface of the second portion. In another embodiment, the step of positioning the second portion adjacent to the first portion does not deflect the contact members and the first distal ends do not extend above the upper surface of the second portion.

In one embodiment, the step of displacing the second portion deflects the contact members so that the first distal ends extend above the upper surface of the second portion. In another embodiment, the step of displacing the second portion reduces a deflecting force on the contact members so that the first distal ends extend above the upper surface of the second portion.

In one embodiment, a first circuit member is positioned against the upper surface of the second portion. The second portion of the housing is displaced so that the first distal ends of the contact members electrically couple with contact pads on the first circuit member.

The present normally closed connector provides a natural coupling and decoupling between devices, the connector housing, and a PCB. Movement of the contact members corrects for lack of co-planarity, provides shock and vibration dampening, and reduces stress at the interface. The housing and contact member geometry and material are designed primarily to provide the desired deflection mechanism, rather than contact retention. The contact members allow for compression of both contact tips approximately at the same time. The achievable pitch is less than comparable technologies.

The base metal of the contact members substantially defines the mode of compliance, providing long term connection that resists failure due to fatigue, vibration, temperature fluctuation, and excessive or repeated insertion. The contact members can be independently adjusted to engage with a wide range of circuit members. The present connector also allows the contact members to be arranged with a pitch of less than about 0.4 millimeters and preferably a pitch of less than about 0.2 millimeters without shorting.

The distal ends of the contact members are capable of engaging with a connector member selected from the group consisting of an edge card, a j-lead device, a flex circuit, a ribbon connector, a printed circuit board, a bare die device, a flip chip, a cable, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), and a chip scale package (CSP).

The first circuit member can be removed and replaced in the event of failure, upgraded, or changed in configuration. The short electrical length of the normally closed connector allows for excellent signal integrity and overall size similar to current packaging techniques. By eliminating the need to solder the first circuit members into the module, the present invention greatly reduces the implications of known good die or burn-in packaged integrated circuits.

The present invention is also directed to a replaceable chip module having a plurality of device sites capable of receiving a plurality of first circuit members. One or more of the device sites include the normally closed connector of the present invention.

The present invention is also directed to a method of utilizing the present replaceable chip module during multiple phases in the life of an integrated circuit device. After placement into the replaceable chip module, the integrated circuit devices can be tested, identified, burned-in, and used in production without ever having to be removed or handled. If one or more of the integrated circuit devices fails during the testing, identification, burn-in, or production phases, the individual circuit device can be removed from the replaceable chip module without damage to the other integrated circuit devices or the replaceable chip module.

BRIEF DESCRIPTION OF THE SEVERAL VIEWS OF THE DRAWINGS

FIG. 1 is a side sectional view of a normally open LGA connector.

FIG. 2 is a side sectional view of the connector of FIG. 1 engaged with an LGA device.

FIG. 3 is a side sectional view of a normally closed connector in accordance with the present invention.

FIG. 4 is a side sectional view of the normally closed connector of FIG. 3 engaged with an LGA device.

DETAILED DESCRIPTION OF THE INVENTION

Figure 6:
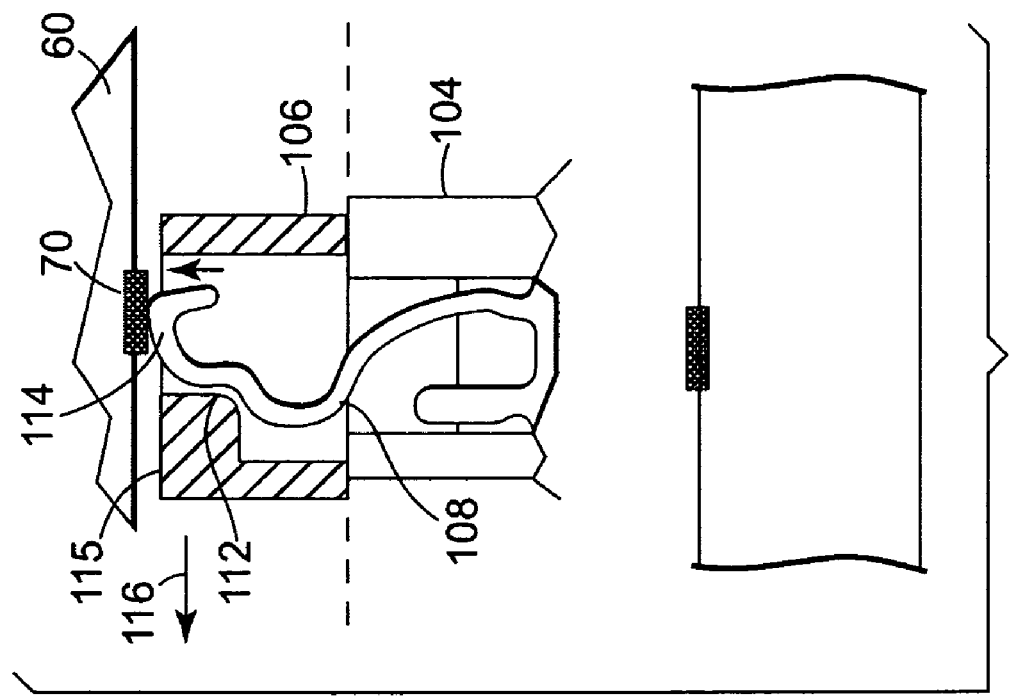
FIG. 6 is a side sectional view of the normally closed connector of FIG. 5 engaged with an LGA device.

The present invention relates to an alternate mechanism and method for actuating an LGA socket such that the contact tips are not exposed to damage prior to insertion of the LGA device. The actuating device can also control the force applied by the contact members on the LGA device.

As illustrated in FIGS. 3 and 4, the connector 50 includes a housing 52 with a first portion 54 and a second portion 56.

In the illustrated embodiment, the first portion 54 is stationary and retains contact members 58. The contact members 58 are preferably stamped or formed. The contact members 58 can be retained in the first portion 54 of the housing 52 by press fitting, insert molding, encapsulating, stitching, and a variety of other techniques. Various configurations of contact members and methods of encapsulating such contact members are disclosed in U.S. Pat. Nos. 5,913,687; 5,938,451; 6,135,783; 6,178,629; 6,231,353; 6,247,938 and 6,409,521, all issued to Rathburn. Although only two contact members 58 are illustrated, a two-dimensional array of hundreds of contact members would typically be used for most applications.

Prior to engagement with the first circuit member 60, first distal ends 62 of the contact members 58 do not extend substantially above upper surface 64 of the housing 52. In the preferred embodiment, the first distal ends 62 are positioned coplanar with or below the upper surface 64. The configuration of FIG. 3 is referred to as a normally closed configuration. In the illustrated embodiment, the contact members 58 are in a substantially relaxed condition. That is, the contact members 58 are in a normally closed position without being subject to substantial external forces.

The second portion 56 of the connector housing 52 is preferably translatable relative to the first portion 54 in at least one direction. In one embodiment, the second portion 56 can slide or translate relative to the second portion 54 along plane 55. In the illustrated embodiment, the first portion can be translated in the X, Y or Z directions (see FIGS. 9 and 10), depending on the desired effect or design of the contact members 58. Various z-axis deflection structures are illustrated in U.S. Pat. No. 6,572,396 (Rathburn).

Figure 7:
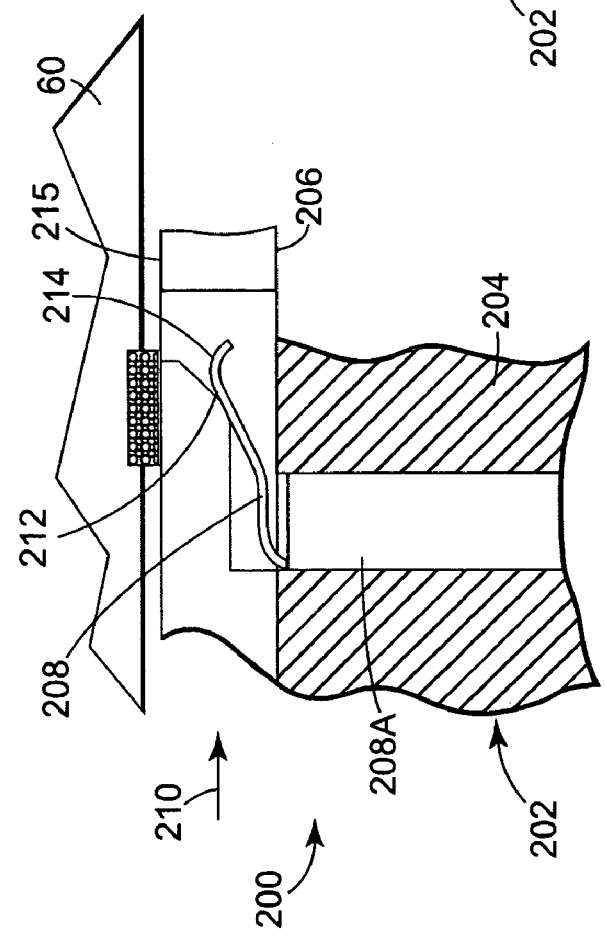
FIG. 7 is a side sectional view of an alternate normally closed connector in accordance with the present invention.

In operation, the LGA device 60 is placed into a socket, such as for example the socket 406 in FIG. 7. No load is applied to the contact members 58 because they do not extend substantially above the upper surface 64. The LGA device 60 is restricted from movement in the Z direction, such as by the cover 408 in FIG. 7. In an embodiment where the first distal ends 62 extend slightly above the upper surface 64, the contact members 58 may be slightly compressed in the Z direction as the LGA device 60 is inserted into the socket 406.

As best illustrated in FIG. 4, the second portion 56 of the housing 52 is translated in a direction 66. Surface 68 on the second portion 56 flexes the contact members 58 in the direction 66 so that the distal ends 62 move in the direction 67 to engage with contact pads 70 on the LGA device 60. The second portion 56 preferably applies a force to the contact members 58 that is less than the force that would be applied if the contact members 58 were in a normally open configuration. The balance of the required force is carried by the contact members 58.

The normally closed connector 50 supplements the force of the contact members 58 against the contact pad 70. The surface 68 in FIG. 4 supports the engagement of the first distal ends 62 with the contact pads 70. The resulting force at the interface of the first distal end 62 and the contact pad 70 is the combination of the resilience of the contact members 58 and the force the translatable second portion 56 applies to the first distal end 62. The force applied by the second portion 56 can be adjusted by varying the amount of displacement relative to the second portion 54.

In one embodiment, the translation of the second portion 56 typically causes the distal ends 62 to extend above the upper surface 64 and to make contact with the pads 70 on the LGA device 60. In another embodiment, the LGA device 60 is tightly engaged with the upper surface 64 so that the distal ends 62 electrically couple with the contact pads 70, but does not extend a significant amount above the upper surface 64. It is preferred that the LGA device 60 moves slightly in a direction 69 parallel to the plane 55 such that the distal ends 62 perform a wiping action on the contact pads 70 to improve electrical contact notwithstanding any oxides or debris.

In one embodiment, the translatable second portion 56 of the connector housing 52 engages the contact members 58 after the connector 50 is attached to second circuit member 72. The connector 50 is preferably attached to the second circuit member 72 using surface mount technology. For example, solder balls 74 can be electrically and mechanically coupled to contact pads 76 on the second circuit member 72. The second circuit member 72 can be a printed circuit board, a circuit module, an integrated circuit device, a cable, a flex circuit, a ribbon connector, an integrated circuit device, including surface mounted devices, and a variety of other electrical components. Alternatively, the connector 50 can be activated without being attached to the circuit member 72.

The first distal ends 62 of the contact members 58 are protected by the second portion 56 from damage prior to engagement with the LGA device 60. In normally open connectors, the distal ends are exposed to damage. The consequences of damage are significant since if one contact member is damaged, the entire printed circuit assembly to which the connector is attached is typically discarded due to the low probability of successfully repairing the contact member.

The method of applying a deflective load to the contact members by displacing the second portion results in a total load requirement placed upon the present normally closed connector system to be less than the theoretical load required to compress all of the contacts in a normal direction. This load reduction significantly reduces the stress applied to the device, connector, printed circuit, hardware, etc.

Figure 5:
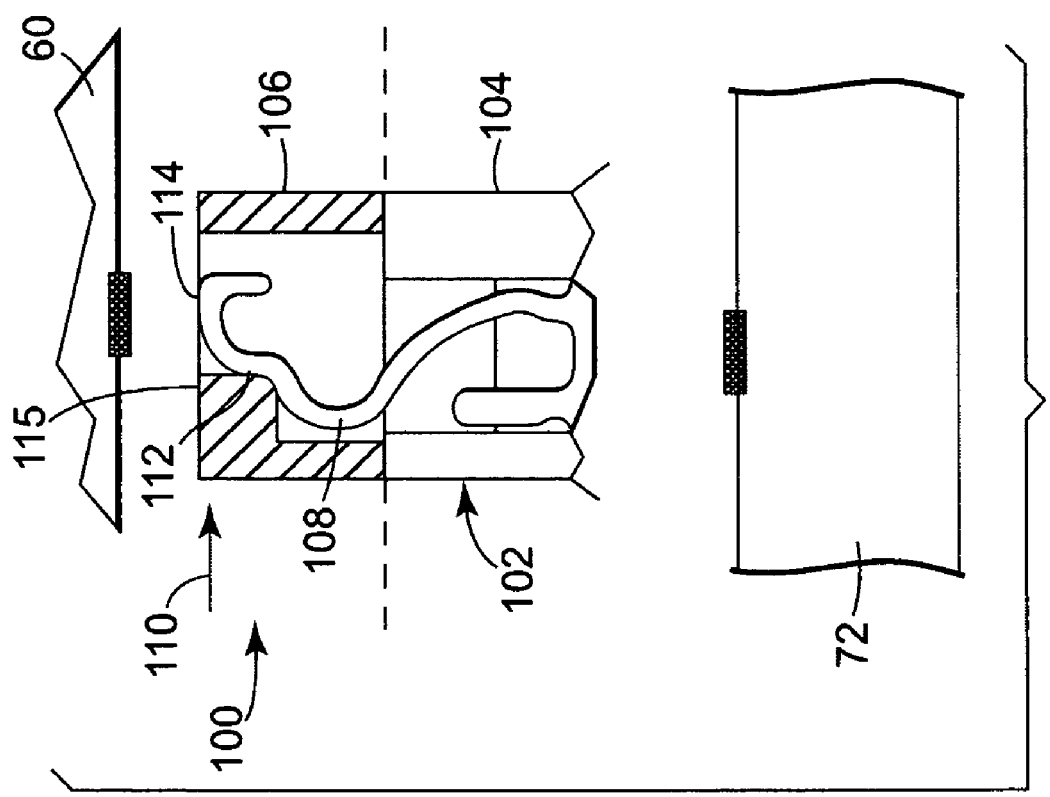
FIG. 5 is a side sectional view of an alternate normally closed connector in accordance with the present invention.

FIGS. 5 and 6 illustrate an alternate connector 100 in accordance with the present invention. Housing 102 includes a first portion 104 and a second portion 106. In the illustrated embodiment, the first portion 104 retains contact members 108. Second portion 106 of the housing 102 is translated in a direction 110 so that surface 112 flexes the contact member 108. The second portion 106 is translated a sufficient amount so that first distal end 114 of the contact member 108 does not extend substantially above upper surface 115 of the housing 102. In the preferred embodiment, the first distal ends 114 are positioned coplanar with or below the upper surface 115. The configuration of FIG. 5 is referred to as a normally closed configuration. In the illustrated embodiment, the contact member 108 is in a flexed condition to achieve the normally closed configuration.

Since the contact member 108 is in a normally closed configuration, the LGA device 60 can be placed into the socket with minimal or no load being applied to the first distal ends 114. The LGA device 60 is preferably restricted from movement in the Z direction. As best illustrated in FIG. 6, the second portion 106 is translated in a direction 116. The surface 112 releases some or all of the force being applied to the contact member 108 so that the distal end 114 is engaged with contact pad 70 on the LGA device 60.

The connector 100 is preferably mounted on second circuit member 72 as discussed above. The second circuit member 72 can be a printed circuit board, a circuit module, an integrated circuit device, a cable, a flex circuit, a ribbon connector, an integrated circuit device, including surface mounted devices, and a variety of other electrical components.

In the embodiment of FIGS. 5 and 6, the reversal of the contact deflection direction directly reduces the stress applied to the contact member since the resultant load after the contacts are released and allowed to extend towards the device is less than the theoretical 90-degree or normal load. This configuration reduces the effects of stress relaxation on the contact members and the surrounding polymer housing that retains them. The present method theoretically narrows the force and deflection variation across a given array of contacts since the effective distance required to achieve electrical coupling with all pads is reduced vs. the normally open method of insertion. The present normally closed connector should also increase the effective working range of the contact members since they will only need to move a slight distance in order to extend far enough to reach the LGA device, while substantially balancing the load across the connector and reducing the stress effect on the SMT solder joint at the second circuit member (e.g., printed circuit board).

Figure 8:
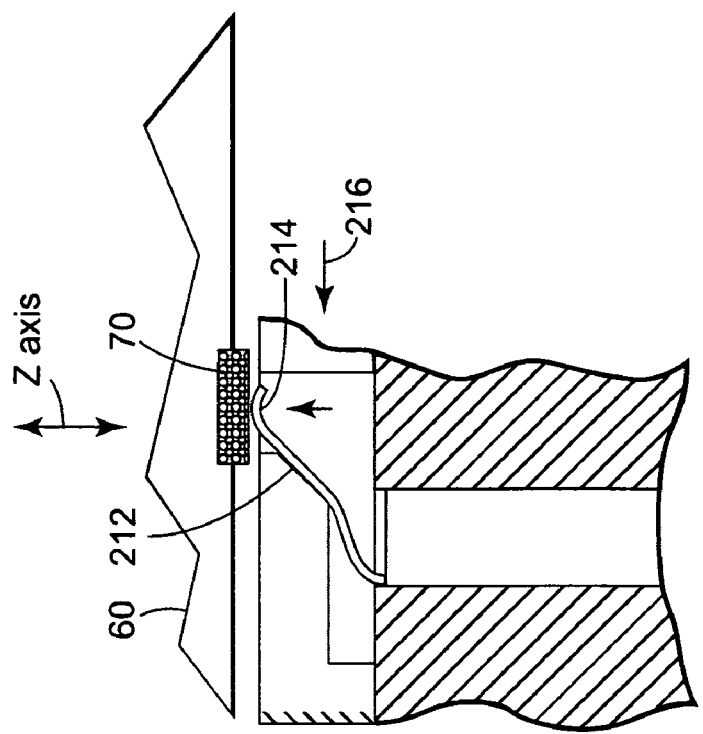
FIG. 8 is a side sectional view of the normally closed connector of FIG. 7 engaged with an LGA device.

FIGS. 7 and 8 illustrate an alternate connector 200 in accordance with the present invention. Housing 202 includes a first portion 204 and a second portion 206. In the illustrated embodiment, contact members 208 are attached to, or an extension of, contact members 208A. Contact members 208A are retained in the first portion 204. Second portion 206 of the housing 202 is translated in a direction 210 so that surface 212 flexes the contact members 208. The second portion 206 is translated a sufficient amount so that first distal end 214 of the contact members 208 does not extend substantially above upper surface 215 of the housing 202. This configuration is referred to as a normally closed configuration. In the illustrated embodiment, the contact members 208 are in a flexed condition to achieve the normally closed configuration.

Since the contact members 208 are in a normally closed configuration, the LGA device 60 can be placed into the socket with minimal or no load being applied to the first distal ends 214. The LGA device 60 is preferably restricted from movement along the Z-axis. As illustrated in FIG. 8, the second portion 206 is translated in a direction 216. The surface 212 is displaced to release some or all of the force being applied to the contact members 208 so that the distal end 214 is engaged with contact pad 70 on the LGA device 60.

Figure 10:
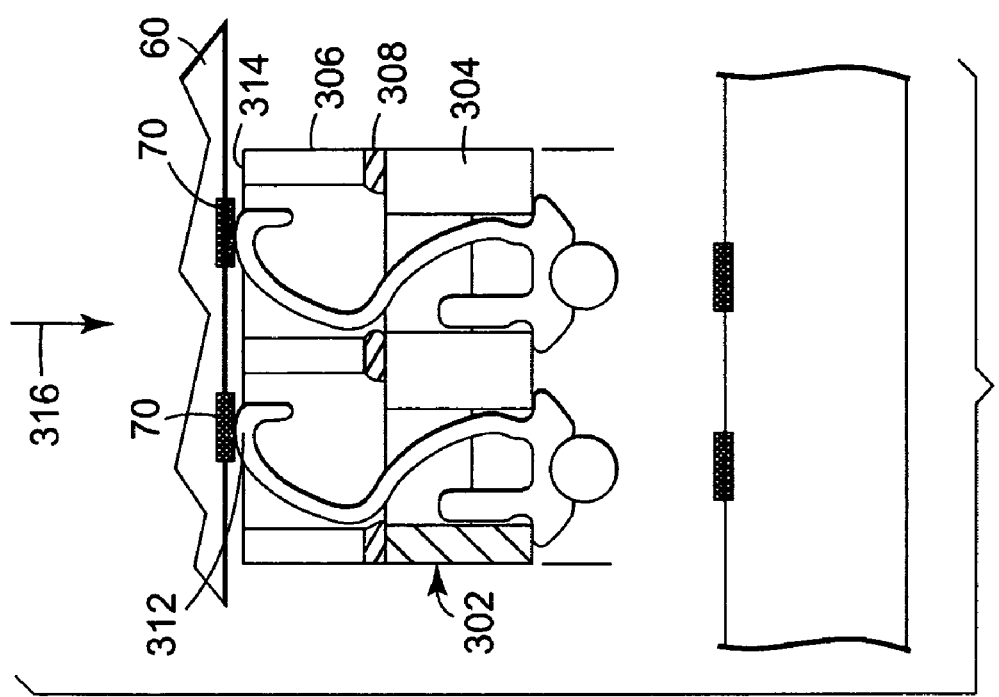
FIG. 10 is a side sectional view of the normally closed connector of FIG. 9 engaged with an LGA device.
Figure 9:
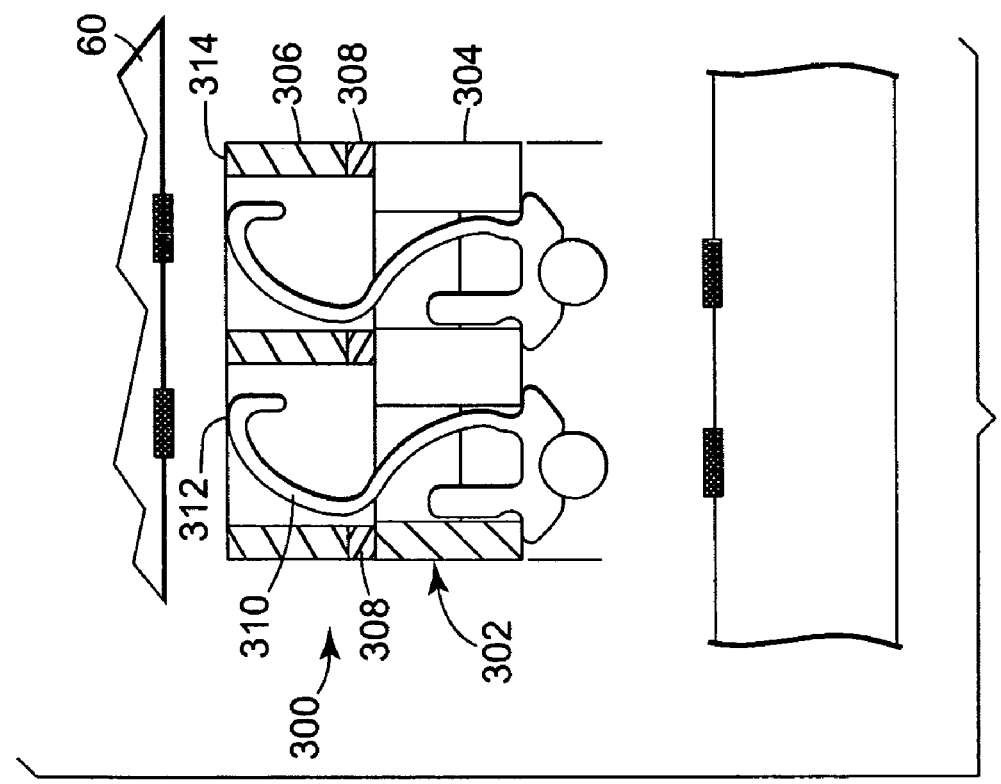
FIG. 9 is a side sectional view of an alternate normally closed connector in accordance with the present invention.

FIGS. 9 and 10 illustrate an alternate connector 300 in which the second portion 306 is translated along the z-axis in accordance with the present invention. Housing 302 includes a first portion 304 and a second portion 306 separated by a compressible material 308. The compressible material 308 can be elastically or inelastically compressible. The contact members 310 are retained in the first portion 304. Second portion 306 of the housing 302 is separated from the first portion 304 by the compressible material 308 a sufficient amount so that first distal ends 312 of the contact members 310 do not extend substantially above upper surface 314 of the housing 302. In the preferred embodiment, the first distal ends 312 are positioned coplanar with or below the upper surface 314. The configuration of FIG. 9 is referred to as a normally closed configuration. In the illustrated embodiment, the contact members 310 are in a relaxed state in the normally closed configuration.

Since the contact members 310 are in the normally closed configuration, the LGA device 60 can be placed into the socket with minimal or no load being applied to the first distal ends 312. The LGA device 60 is preferably restricted from movement along the Z-axis relative to the second portion 306. As illustrated in FIG. 10, a force 316 is applied to the second portion 306 that is sufficient to at least partially compress the compressible material 308. The first distal ends 312 of the contact members 310 are positioned above the upper surface 314 to engage with contact pad 70 on the LGA device 60. In an alternate embodiment, the force 316 is applied to both the second portion 306 and the LGA device 60.

For typical connector applications, the parameters discussed below are common, but are not intended to be all-inclusive or a requirement for a particular design. The overall contact member deflection is typically within the range of about 0.254 millimeters (0.010 inches) to about 3.05 millimeters (0.12 inches), with a working range of about 0.152 millimeters (0.006 inches). Interconnect or device pitch is typically about 1.0 millimeter to about 1.27 millimeters in a variety of array patterns. The contact force is typically about 20 to about 30 grams average per contact at maximum insertion of the device. The maximum contact height is about 2 millimeters. The maximum contact inductance is less than about 1 nano-Henry and the maximum contact member capacitance is less than about 0.1 picofarads. The bandpass is less than about 1 decibels loss at about 1 to about 2 giga-hertz. The maximum contact resistance is about 15 milli-ohms and the current carrying capability is about 0.5 amps to about 1 amp.

The housings may be constructed of a dielectric material, such as plastic. Suitable plastics include phenolics, polyesters, and Ryton® available from Phillips Petroleum Company. Alternatively, the housing is constructed from metal, such as aluminum, with a non-conductive surface, such as an anodized surface. For some applications, the metal housing may provide additional shielding of the contact members. In an alternate embodiment, the housing is grounded to the electrical system, thus providing a controlled impedance environment. Some of the contact members can be grounded by permitting them to contact an uncoated surface of the metal housing. As used herein, an "electrically insulative connector housing" or a "module housing" refers to a housing that is either non-conductive or substantially coated with a non-conductive material to prevent unwanted conductivity between the contact members and the housing, as discussed above.

The contact members are preferably constructed of copper or similar metallic materials such as phosphor bronze or beryllium-copper. In one embodiment, the contact members are BeCu alloy about 0.051 millimeters (0.002 inches) to about 0.152 millimeters (0.006 inches) thick with a nickel underplate and gold/palladium plating. The contact members are preferably plated with a corrosion resistant metallic material such as nickel, gold, silver, palladium, or multiple layers thereof. In embodiments where the contact members are encapsulated, the encapsulating material is typically silicone based with a Shore A durometer of about 20 to about 40. Examples of suitable encapsulating materials include Sylgard® available from Dow Corning Silicone of Midland, Mich. and Master Sil 713 available from Master Bond Silicone of Hackensack, NJ.

Figure 11:
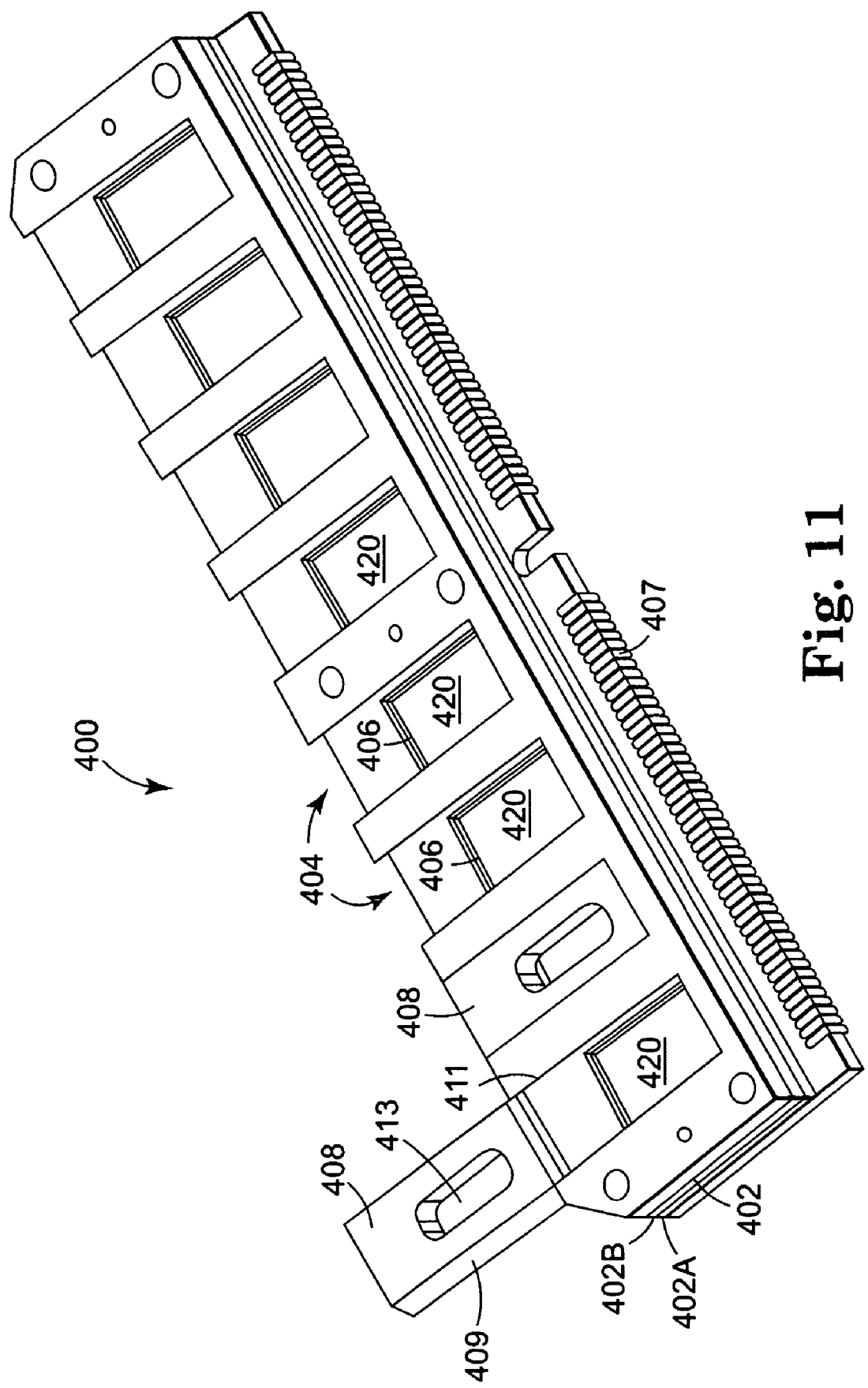
FIG. 11 is an exemplary replaceable chip module using a normally closed connector in accordance with the present invention.

FIG. 11 is a perspective view of an exemplary replaceable chip module 400 using the normally closed connector in accordance with the present invention. Housing 402 has an first portion 402A and a second portion 402B, and a plurality of device sites 404 for receiving one or more first circuit members 60 (see FIGS. 3–10). The first portion 402A can be shifted relative to the second portion 402B to activate the contact members (see FIGS. 4 and 6). In the embodiment of FIG. 7, the device site 404 comprises a socket 406 configured to receive the first circuit members 60. The first circuit members 60 are typically a bare die integrated circuit device or a packaged integrated circuit device.

A cover 408 is provided for the device sites 404 for retaining the first circuit members 60 in the socket 406. In the embodiment of FIG. 7, the covers 408 have a beveled edge 409 for sliding engagement with a corresponding lip 411 on the housing 402. The cover 408 may optionally have an opening 413 for viewing identifying markings on the first circuit members 60. Covers 408 with openings 413 are not-preferred for bare die silicon IC devices. A normally closed connector 50, 100, such as discussed in connection with FIGS. 3–6 is located at the base of the socket 406. The cover 408 and/or the housing 402 can function as heat sinks and/or may be constructed from a resilient material to allow for additional planar compliance between the circuit members 60 and the normally closed connectors 50, 100.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A normally closed connector apparatus for electrically connecting first and second circuit members, comprising:
   an electrically insulative connector housing comprising a first portion translatable relative to a second portion, the connector housing being adapted to be positioned substantially between the first and second circuit members; and
   a plurality of resilient contact members retained in the first portion of the housing, the contact members have first distal ends that do not extend substantially above an upper surface of the second portion, and second distal ends that extend above a lower surface of the first portion, such that displacement of the second portion relative to the first portion comprises a translated configuration that reduces a deflecting force on the contact members so that the first distal ends extend above the upper surface of the second portion to electrically couple with the first circuit member.

2. The apparatus of claim 1 wherein the second portion deflects the contact members in the translated configuration so that the first distal ends extend above the upper surface of the second portion.

3. The apparatus of claim 1 wherein the translated configuration reduces stress on the contact members.

4. The apparatus of claim 1 wherein the first portion translates relative to the second portion in a single plane.

5. The apparatus of claim 1 wherein the first portion translates relative to the second portion along two axes in a single plane.

6. The apparatus of claim 1 wherein elastic deformation of the contact members is defined by a geometry of the contact members.

7. The apparatus of claim 1 wherein elastic deformation of the contact members is defined by a thickness of the contact members.

8. The apparatus of claim 1 wherein the contact members comprise a planar structure and elastic deformation of the contact members is defined by at least one cut-out in the planar structure.

9. The apparatus of claim 1 wherein the contact members comprise at least one helical portion.

10. The apparatus of claim 1 wherein the contact members comprise a planar structure and the first distal end comprises a structure at generally a right angle with respect to the planar structure.

11. The apparatus of claim 1 wherein the first distal ends comprise a shape complementary to a shape of a contact pad on the first circuit member.

12. The apparatus of claim 1 wherein the connector apparatus comprises a replaceable chip module having a plurality of device sites capable of receiving a plurality of first circuit members.

13. The apparatus of claim 1 wherein the second distal ends are electrically coupled to the second circuit member.

14. The apparatus of claim 1 wherein the contact members comprise second distal ends electrically and mechanically coupled to a second circuit member.

15. The apparatus of claim 1 wherein the circuit members comprise one of a packaged integrated circuit device, an unpackaged integrated circuit device, a printed circuit board, a flexible circuit, a bare-die device, an organic or inorganic substrate, or a rigid circuit.

16. The apparatus of claim 1 wherein the first circuit member is an LGA device.

17. A method of operating a normally closed connector apparatus to electrically connect first and second circuit members, comprising the steps of:
   locating a plurality of resilient contact members in a first portion of a housing such that second distal ends of the contact members extend above a lower surface of the first portion;
   positioning a second portion of the housing adjacent to the first portion so that first distal ends of the contact members extend through the second portion but do not extend substantially above an upper surface of the second portion; and
   reducing a deflection force on the contact members by displacing the second portion relative to the first portion, so that the first distal ends extend above the upper surface of the second portion to electrically couple with the first circuit member.

18. The method of claim 17 wherein the step of positioning the second portion adjacent to the first portion deflects the contact member so that the first distal ends do not extend above the upper surface of the second portion.

19. The method of claim 17 wherein the step of positioning the second portion adjacent to the first portion does not deflects the contact members and the first distal ends do not extend above the upper surface of the second portion.

20. The method of claim 17 wherein the step of displacing the second portion deflects the contact members so that the first distal ends extend above the upper surface of the second portion.

21. The method of claim 17 wherein the step of displacing the second portion reduces a deflecting force on the contact members so that the first distal ends extend above the upper surface of the second portion.

22. The method of claim 17 comprising the steps of:
   positioning a first circuit member against the upper surface of the second portion; and displacing the second portion so that the first distal ends of the contact members electrically couple with contact pads on the first circuit member.

23. A connector apparatus for electrically connecting first and second circuit members, comprising:
an electrically insulative connector housing comprising a first portion translatable relative to a second portion, the connector housing being adapted to be positioned substantially between the first and second circuit members; and
a plurality of resilient contact members having first distal ends that do not extend substantially above an upper surface of the second portion, such that displacement of the second portion relative to the first portion comprises a translated configuration that reduces a deflecting force on the contact members so that the first distal ends extend above the upper surface of the second portion to electrically couple with the first circuit member.

24. The apparatus of claim 23 wherein the first portion translates relative to the second portion in a single plane.

25. The apparatus of claim 23 wherein elastic deformation of the contact members is defined by a geometry of the contact members.

26. The apparatus of claim 23 wherein the connector apparatus comprises a replaceable chip module having a plurality of device sites capable of receiving a plurality of first circuit members.

27. The apparatus of claim 23 wherein the second distal ends are electrically coupled to the second circuit member.

28. The apparatus of claim 23 wherein the contact members comprise a non-linear shape.

29. The apparatus of claim 23 wherein the contact members are in a normally closed position without being subject to substantial external forces.

30. The apparatus of claim 23 wherein the contact members are retained in the first portion of the housing by one of press fining, insert molding, encapsulating, or stitching.

31. A connector apparatus for electrically connecting first and second circuit members, comprising:
an electrically insulative connector housing comprising a first portion translatable relative to a second portion, the connector housing being adapted to be positioned substantially between the first and second circuit members; and
a plurality of non-linear, resilient contact members retained in the first portion of the housing by one of press fitting, insert molding, encapsulating, or stitching, the contact members have first distal ends that do not extend substantially above an upper surface of the second portion, such that displacement of the second portion relative to the first portion comprises a translated configuration that changes a deflecting force on the contact members so that the first distal ends extend above the upper surface of the second portion to electrically couple with the first circuit member.

32. The apparatus of claim 31 wherein the second distal ends are electrically coupled to the second circuit member.

33. A connector apparatus for electrically connecting first and second circuit members, comprising:
an electrically insulative connector housing comprising a first portion translatable relative to a second portion, the connector housing being adapted to be positioned substantially between the first and second circuit members; and
a plurality of resilient contact members having first distal ends that do not extend substantially above an upper surface of the second portion, such that displacement of the second portion relative to the first portion comprises a translated configuration that reduces stress on the contact members so that the first distal ends extend above the upper surface of the second portion to electrically couple with the first circuit member.

* * * * *

UNITED STATES PATENT AND TRADEMARK OFFICE
CERTIFICATE OF CORRECTION

PATENT NO.        : 7,214,069 B2                                   Page 1 of 1
APPLICATION NO.   : 11/325127
DATED             : May 8, 2007
INVENTOR(S)       : James J. Rathburn It is certified that error appears in the above-identified patent and that said Letters Patent is hereby corrected as shown below:

<u>Column 11, line 37</u>

Claim 30 delete the word "fining" and replace it with -- fitting --

Signed and Sealed this

Twenty-sixth Day of June, 2007

JON W. DUDAS
*Director of the United States Patent and Trademark Office*